United States Patent
Boyea, Jr. et al.

(10) Patent No.: US 9,966,292 B2
(45) Date of Patent: May 8, 2018

(54) CENTERING FIXTURE FOR ELECTROSTATIC CHUCK SYSTEM

(71) Applicant: GLOBALFOUNDRIES INC., Grand Cayman (KY)

(72) Inventors: Donald R. Boyea, Jr., Mineville, NY (US); Matthew J. Bombardier, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 139 days.

(21) Appl. No.: 15/207,524

(22) Filed: Jul. 12, 2016

(65) Prior Publication Data

US 2018/0019147 A1 Jan. 18, 2018

(51) Int. Cl.
*H01L 21/683* (2006.01)
*H01L 21/68* (2006.01)
*B25J 9/16* (2006.01)

(52) U.S. Cl.
CPC .......... *H01L 21/6833* (2013.01); *B25J 9/163* (2013.01); *B25J 9/1692* (2013.01); *H01L 21/68* (2013.01)

(58) Field of Classification Search
CPC ................. H01L 21/6833; H01L 21/68; H01L 21/67265; H01L 21/682; H01L 21/67748; H01L 21/67259; B25J 9/1692; B25J 9/163; G01N 2021/8864; G01N 21/9501
USPC .................................................. 700/245, 254
See application file for complete search history.

(56) References Cited

U.S. PATENT DOCUMENTS

| | | | |
|---|---|---|---|
| 4,659,094 A | 4/1987 | Leonov | |
| 6,237,393 B1 | 5/2001 | Ames et al. | |
| 6,425,280 B1 | 7/2002 | Ames et al. | |
| 6,478,532 B1 * | 11/2002 | Coady | H01L 21/681 414/783 |
| 6,934,606 B1 | 8/2005 | Genetti et al. | |
| 7,214,552 B2 | 5/2007 | Devany et al. | |
| 8,060,330 B2 * | 11/2011 | O'Neill | H01L 21/68 438/14 |
| 2002/0048506 A1 * | 4/2002 | Babbs | B25J 15/0206 414/783 |
| 2002/0153676 A1 * | 10/2002 | Noguchi | H01L 21/67288 279/106 |
| 2006/0102285 A1 * | 5/2006 | Bluck | H01L 21/67161 156/345.32 |
| 2006/0110836 A1 * | 5/2006 | Devany | H01L 21/67265 438/5 |
| 2007/0004058 A1 * | 1/2007 | Lee | H01L 21/681 438/14 |
| 2008/0081383 A1 * | 4/2008 | Chen | G05B 19/41875 438/14 |

(Continued)

*Primary Examiner* — Jaime Figueroa
(74) *Attorney, Agent, or Firm* — Anthony Canale; Hoffman Warnick LLC (57) ABSTRACT

A centering fixture for centering a wafer on a chuck is provided. The centering fixture includes a body including an upper surface, a lower surface, an inner periphery and an outer periphery. A chuck seat is positioned in a lower portion of the inner periphery and configured to mate the body with the chuck. A wafer seat is positioned in an upper portion of the inner periphery above the chuck seat, the wafer seat configured to receive and center the wafer on the chuck. The centering fixture ensures centering of the wafer relative to the chuck for automated handling system calibration. The wafer, body, chuck, chuck seat and wafer seat can be circular.

20 Claims, 6 Drawing Sheets

(56) References Cited

U.S. PATENT DOCUMENTS

| | | | | |
|---|---|---|---|---|
| 2008/0239308 | A1* | 10/2008 | Ravid | G01N 21/253 356/302 |
| 2009/0062959 | A1* | 3/2009 | Sakhare | B25J 9/1692 700/254 |
| 2010/0150695 | A1* | 6/2010 | O'Neill | H01L 21/67259 414/806 |
| 2010/0277749 | A1* | 11/2010 | Rodnick | H01L 21/67069 356/623 |
| 2011/0139757 | A1* | 6/2011 | Millman, Jr. | B23K 26/0676 219/121.69 |
| 2012/0325275 | A1* | 12/2012 | Goodman | B23B 31/14 134/149 |
| 2013/0130593 | A1* | 5/2013 | Kalenian | B24B 49/00 451/5 |

* cited by examiner

CENTERING FIXTURE FOR ELECTROSTATIC CHUCK SYSTEM

BACKGROUND

The present disclosure relates to semiconductor fabrication, and more specifically, to a centering fixture for an electrostatic chuck system and method of training an automated handling system.

In semiconductor wafer fabrication, each wafer is transported between a large variety of semiconductor processing systems to conduct different fabrication processes on a wafer. The tasks carried out by each chamber can vary, e.g., deposition, etching, etc. Wafers are moved by automated handlers within and between processing systems. The automated handlers pick up the wafers from one processing system, and move them to a next processing system or within a processing system.

Certain processing systems include a task specific chamber that includes an electrostatic chuck (ESC) system to hold the wafer in a desired location. An ESC system may include a chuck or platen that can be electrostatically charged to hold a wafer in position on the chuck. The chuck may be circular or another shape. In addition, an ESC system includes a set of retractable lift pins upon which a wafer is positioned by an automated handler in a centered fashion relative to the chuck. A wafer that is centered on a respective ESC system in a processing chamber is in an ideal position for accurate and repeatable processing by the particular processing system.

Automated handlers include a carrier arm that carries the wafer and positions it on the set of retractable lift pins in a centered fashion relative to the chuck during entry of the wafer to the respective processing system. Retraction of the lift pins positions the wafer in a centered position on the chuck. Regardless of the processing system, it is important that the wafer is located within the processing system relative to its respective ESC system in a precise and repeatable centered manner so that the subsequent processing can be performed in a repeatable fashion, e.g., uniformly etching the wafer. In order to achieve this precision and repeatability, each automated handling system and, in particular, an aligner system thereof, is calibrated to position the carrier arm of the automated handler such that the wafer is centered relative to the chuck. That is, the aligner system is taught to know the centered location for a wafer relative to the chuck for future reference and use in placing wafers to be processed by the particular system.

One challenge relative to automated handling system calibration is centering the wafer within a particular processing system relative to the chuck. Conventionally, during calibration, a wafer is placed on the chuck within a selected processing system and is visually centered by a user. The aligner system is then calibrated (taught) based on the visual centering. Human variation can adversely impact the calibration.

SUMMARY

A first aspect of the disclosure is directed to a centering fixture for centering a wafer on a chuck, the centering fixture comprising: a body including an upper surface, a lower surface, an inner periphery and an outer periphery; a chuck seat positioned in a lower portion of the inner periphery and configured to mate the body with the chuck; and a wafer seat positioned in an upper portion of the inner periphery above the chuck seat, the wafer seat configured to receive and center the wafer on the chuck.

A second aspect of the disclosure includes a method of training an automated handling system for a semiconductor processing system regarding aligning a wafer to a chuck of the semiconductor processing system, the method comprising: placing an centering fixture on the chuck of the semiconductor processing system, the centering fixture including: a body including an upper surface, a lower surface, an inner periphery and an outer periphery, a chuck seat positioned in a lower portion of the inner periphery and configured to mate the body with the chuck, and a wafer seat positioned in an upper portion of the inner periphery above the chuck seat, the wafer seat configured to receive and align the wafer on the chuck; and calibrating the automated handling system based on a centered position of the wafer provided by the centering fixture.

A third aspect of the disclosure provides an electrostatic chuck (ESC) system, comprising: a chuck; and a centering fixture for centering a wafer on the chuck, the centering fixture including: a body including an upper surface, a lower surface, an inner periphery and an outer periphery, a chuck seat positioned in a lower portion of the inner periphery and configured to mate the body with the chuck, and a wafer seat positioned in an upper portion of the inner periphery above the chuck seat, the wafer seat configured to receive and center the wafer on the chuck.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

A centering fixture is provided that automatically centers a wafer relative to a chuck or platen of an electrostatic chuck (ESC) system. The centering fixture allows for more precise calibration of an automated handling system for a semiconductor processing system by removing human variation in the centering of the wafer. In this fashion, processing steps can be carried out in a more reliable fashion, e.g., uniform etching out to a wafer edge. While the teachings of the disclosure will be described relative to a circular wafer with a circular centering fixture to accommodate a circular chuck, it is emphasized that the centering fixture can be applied to other shaped wafers and chucks, e.g., square, rectangular, etc.

Figure 1:
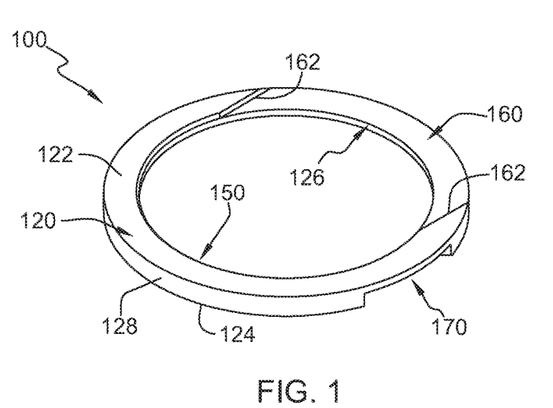
FIG. 1 shows a perspective view of a centering fixture.
Figure 2:
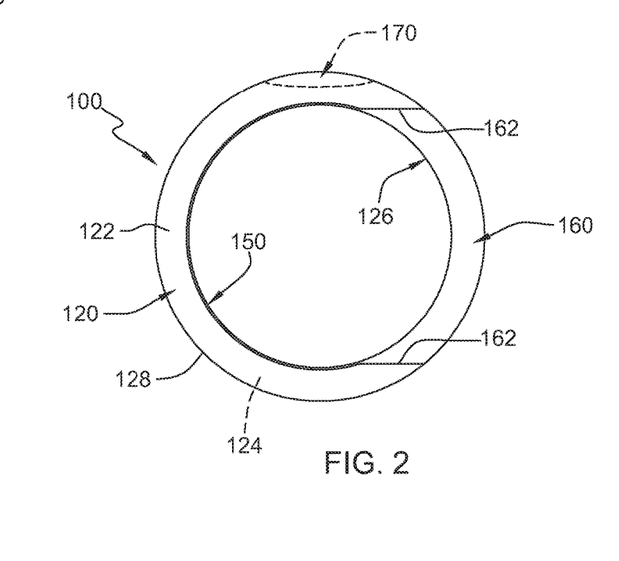
FIG. 2 shows a plan view of a centering fixture.
Figure 3:
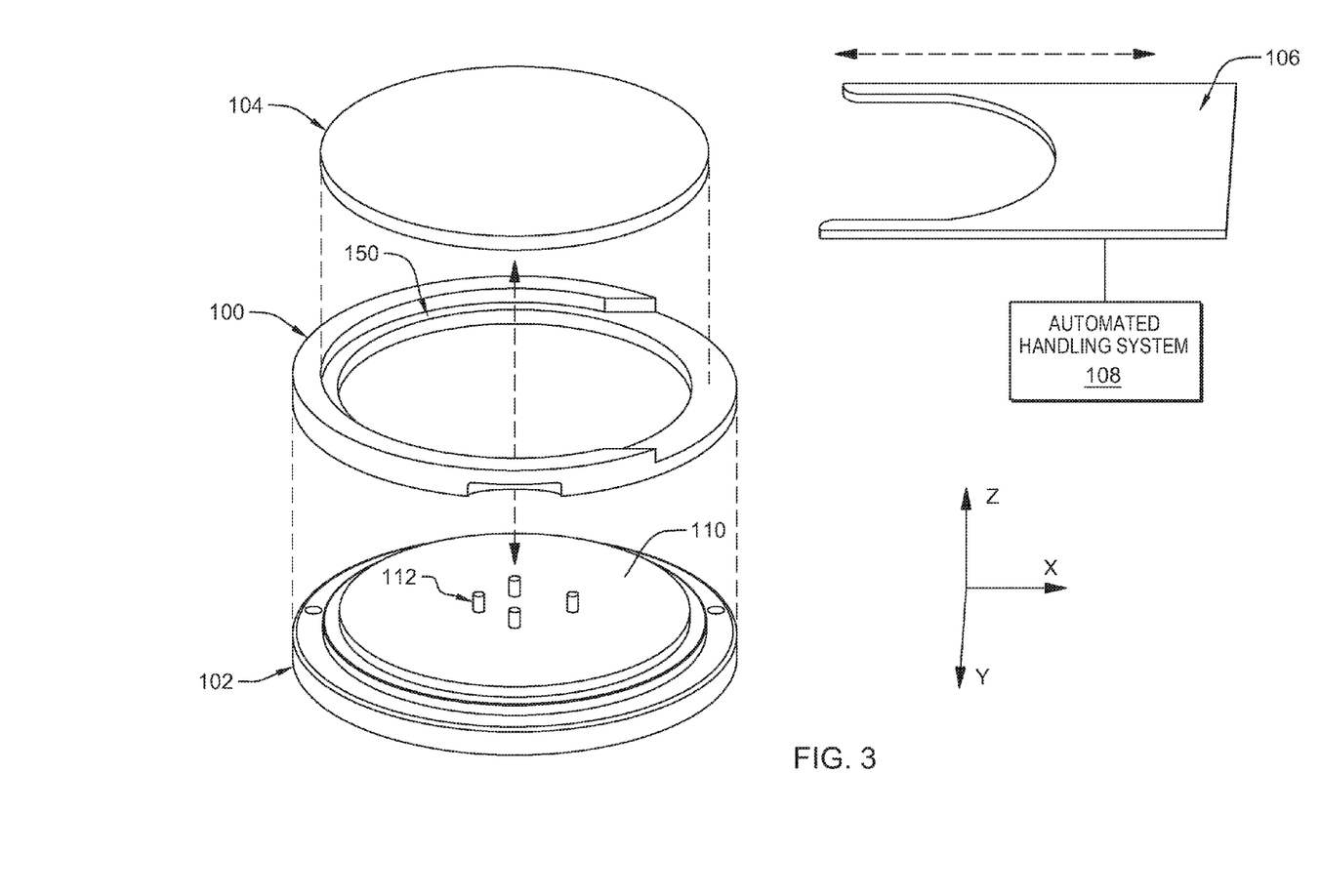
FIG. 3 shows an exploded perspective view of a centering fixture 100 relative to an electrostatic chuck (ESC) system, a circular wafer and an automated handler carrier arm.

With reference to the drawings, a centering fixture 100 for centering a circular wafer on a circular chuck is provided. FIG. 1 shows a perspective view and FIG. 2 shows a plan view of centering fixture 100, and FIG. 3 shows an exploded perspective view of centering fixture 100 relative to an electrostatic chuck (ESC) system 102, a circular wafer 104 and an automated handler carrier arm 106 of an automated handling system 108 (shown schematically) that controls movement of carrier arm 106. ESC system 102 may include any now known or later developed electrostatic chuck system typically used in a semiconductor wafer processing system. As understood, ESC system 102 may include a circular chuck 110, also sometimes referred to as a platen, that electrostatically holds circular wafer 104 thereto during processing provided by the processing system (not shown) within which ESC system 102 is provided. ESC system 102 may also include a set of retractable lift pins 112 (four shown, but could be more) that can be selectively extended to lift circular wafer 104 from carrier arm 106, or retracted to lower circular wafer 104 into contact with circular chuck 110, i.e., under control of automated handling system 108. Circular wafer 104 may include any form of wafer that is to be processed by a semiconductor processing system in which ESC system 102 is provided. The processing system may be any now known or later developed semiconductor processing system, e.g., a deposition system, an etching system such as a LAM® Alliance® etching chamber, etc.

Carrier arm 106 may take the form of any element capable of positioning wafer 104 over ESC system 102. In the example shown, carrier arm 106 includes a forked member allowing lift pins 112 to engage wafer 104, but it can take a variety of forms. As understood, carrier arm 106 is coupled to an automated handling system 108 capable of automatically moving carrier arm 106 in any manner to position wafer, typically vertically, and angularly and/or linearly within a number of selected horizontal planes. It is emphasized that carrier arm 106 and its associated automated handling system 108 can be capable of movement in any manner, e.g., vertically (Z), horizontally (X or Y), rotationally (yaw) about any axis, etc. Automated handling system 108 can include any now known or later developed system capable of automated movement of carrier arm 106 among other structures, such as those available from Brooks Automation Inc., and may include any variety of computer controls, servo-motors, linear actuators, sensors, etc., necessary to affect its operation.

Relative to ESC system 102, under operational control of automated handling system 108, carrier arm 106 picks up circular wafer 104 from a position not over ESC system 102 (e.g., outside of the particular processing system) and moves circular wafer 104 over ESC system 102. Carrier arm 106 then positions circular wafer 104 on retractable lift pins 112 in their extended position, i.e., lowers wafer 104 onto pins 112. Upon retraction of retractable lift pins 112 by automated handling system 108, circular wafer 104 is lowered onto circular chuck 110. As understood, the operation is controlled and synchronized by automated handling system 108.

In order to provide more precise calibration of automated handling system 108, in contrast to conventional automated handling system calibration, centering fixture 100 is positioned on circular chuck 110 to ensure centering of circular wafer 104 with circular chuck 110. In this manner, human variation or error in centering circular wafer 104 on circular chuck 110 is eliminated, and the location of carrier arm 106 required to center circular wafer 104 on circular chuck 110 can be accurately obtained and recorded for future use by automated handling system 108. The calibration can include any now known or later developed processing steps required for the automated handling system 108 used to obtain and record the centered position, e.g., recording carrier arm 106 position in three-dimensional space—X, Y, Z and various yaw positions.

Figure 4:
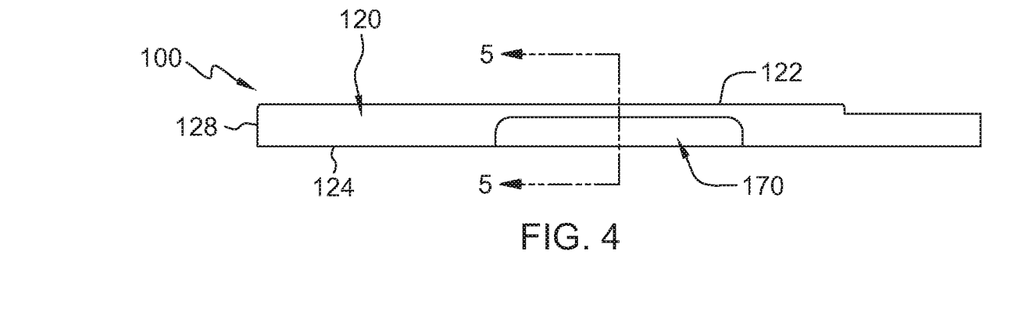
FIG. 4 shows a side perspective view of a centering fixture.
Figure 5:
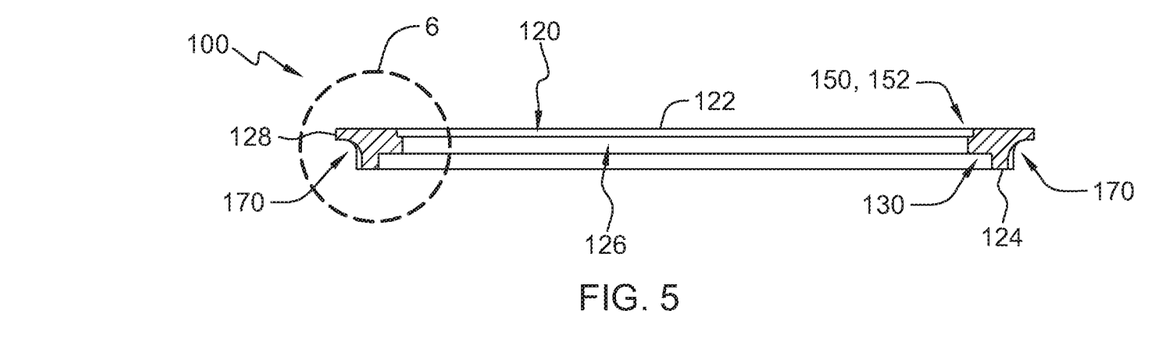
FIG. 5 shows a cross-sectional view of a centering fixture along line 5-5 in FIG. 4.
Figure 6:
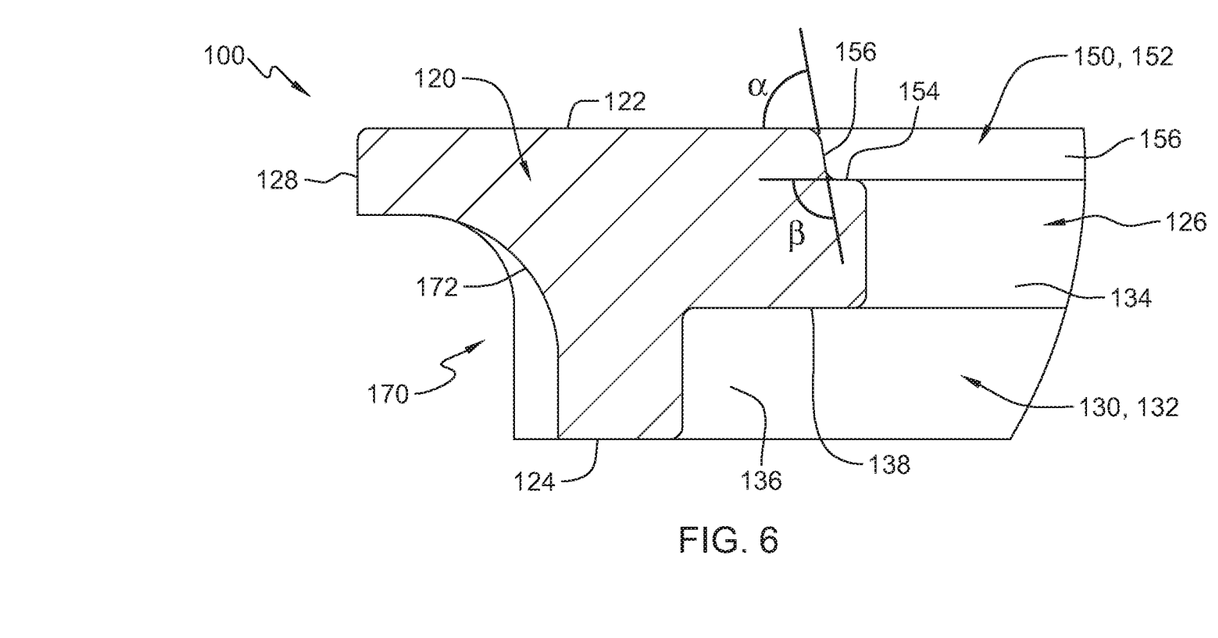
FIG. 6 shows an enlarged cross-sectional view of a portion the centering fixture of FIG. 5.

FIG. 4 shows a side perspective view of centering fixture 100, FIG. 5 shows a cross-sectional view of centering fixture 100 along line 5-5 in FIG. 4, and FIG. 6 shows an enlarged cross-sectional view of a portion of FIG. 5. Referring to FIGS. 1, 2 and 4-6, centering fixture 100 may include a circular body 120 including an upper surface 122, a lower surface 124 (view sometimes obscured), an inner periphery 126 and an outer periphery 128. In this fashion, centering fixture 100 has a generally planar ring configuration.

Figure 7:
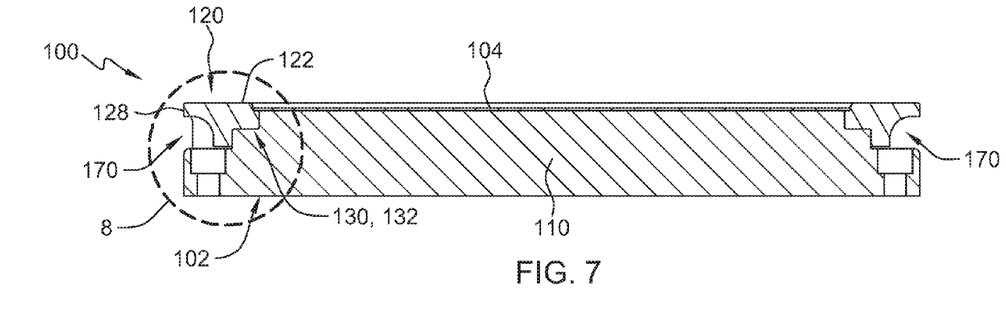
FIG. 7 shows a cross-sectional view of a centering fixture with a circular wafer 100 position on an ESC system.
Figure 8:
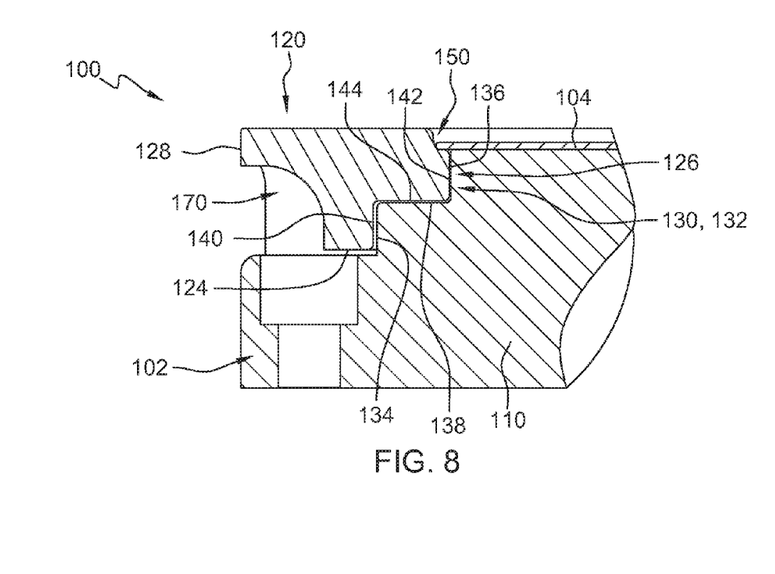
FIG. 8 shows an enlarged cross-sectional view of a portion of the centering fixture and ESC system of FIG. 7.

As shown best in FIG. 6, centering fixture 100 also includes a chuck seat 130 positioned in a lower portion of inner periphery 126 and configured to mate circular body 120 with circular chuck 110 (FIG. 3). More specifically, with circular body and chuck, chuck seat 130 concentrically mates circular body 120 with circular chuck 110 (FIG. 3). Chuck seat 130 may include any number of surfaces configured to (concentrically) mate circular body 120 with circular chuck 110 (FIG. 3). The tolerances may be sufficiently small to ensure a tight fit with very little to no play. In one example, chuck seat 130 includes a stepped seat 132 including a pair of radially spaced (relative to center of centering fixture 100) internally facing surfaces 134, 136 separated by a horizontal surface 138. FIG. 7 shows a cross-sectional view of centering fixture 100 with wafer 100 in position on ESC system 102 and circular chuck 110 (retractable pins not shown), and FIG. 8 shows an enlarged cross-sectional view of a portion of FIG. 7. As shown best in FIG. 8, circular chuck 110 includes a pair of radially spaced (relative to center of circular chuck 110) externally facing surfaces 140, 142 separated by a horizontal surface 144. Centering fixture 100 surfaces 134, 136 and 138 are configured to mate with circular chuck 110 surfaces 140, 142 and 144 to concentrically position centering fixture 100 relative to circular chuck 110. In this example, each surface 134, 136, 138 of stepped seat 132 engages a surface of circular chuck 110; however, this may not be necessary in all instances as a variety of alternative arrangements may exist that ensure concentric positioning.

Returning to FIGS. 1, 5, 6 and 8, centering fixture 100 may also include a wafer seat 150 positioned in an upper portion 152 of inner periphery 126 above chuck seat 130. As shown best in FIG. 8, wafer seat 150 is configured to receive and center circular wafer 104 on circular chuck, i.e., via centering fixture 100. Wafer seat 150 may include any surfaces necessary to support circular wafer 104 in a centered (i.e., aligned such that spacing is equal about opposing sides or concentrically aligned regarding circular structure, as described) manner in centering fixture 100, and thus relative to circular chuck 110. In one example, wafer seat 150 may include a horizontal surface 154 configured to hold circular wafer 104 (FIG. 8), and an entry wall 156 connecting horizontal surface 154 and upper surface 122 and extending at a non-orthogonal angle (α and β) to both. More specifically, entry wall 156 is angled relative to horizontal surface 154 and upper surface 122 so as to form a convex or beveled opening to direct circular wafer 104 into its final position against horizontal surface 154 and a bottom of entry wall 156. A diameter at a bottom of entry wall 156 may approximately match a diameter of circular wafer 104, e.g., for current wafer sizes: 200 millimeters (mm) or 300 mm.

Figure 9:
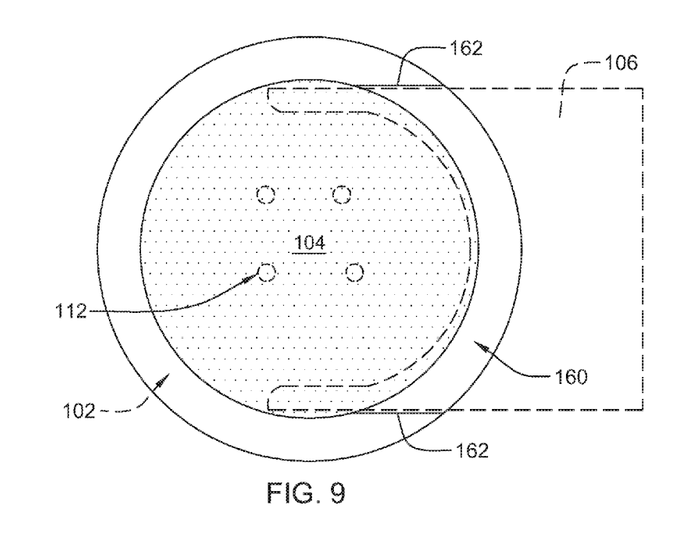
FIG. 9 shows a plan view of a centering fixture with a circular wafer being positioned on an ESC system by a carrier arm.
Figure 10:
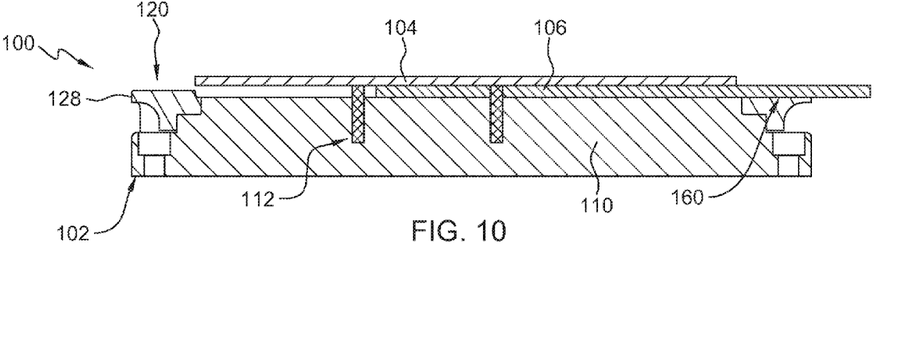
FIG. 10 shows a cross-sectional view of a centering fixture with a circular wafer being positioned on an ESC system by a carrier arm.

FIG. 9 shows a plan view and FIG. 10 shows a cross-sectional view of carrier arm 106 (in phantom in FIG. 9) with circular wafer 104 positioned over centering fixture 100 and ESC system 102. As shown in FIGS. 1, 2, 9 and 10, centering fixture 100 may also optionally include a handler slot 160 in upper surface 122. Handler slot 160, as shown in FIGS. 9 and 10, is configured to allow at least a portion of automated handler carrier arm 106 to pass through circular body 120 to access circular wafer 104. In one embodiment, handler slot 160 may include opposing parallel sides 162 extending tangentially from inner periphery 126 to outer periphery 128. Opposing parallel sides 162 thus form handler slot 160 in upper surface 122 of circular body 120. Handler slot 160 may have any depth required to provide clearance for carrier arm 106.

Referring to FIGS. 2, 5 and 6, centering fixture 100 may also optionally include at least one removal region 170 positioned within lower surface 124 and outer periphery 128. In FIGS. 5 and 6, a pair of opposing removal regions 170 are provided. Each removal region 170 may include a rounded inner surface 172 (FIG. 6 only) extending between outer periphery 128 and lower surface 124. Each removal region 170 may extend to any angular extent desired to allow a user to physically remove, or apply a tool, to remove centering fixture 100 from ESC system 102, i.e., from the position shown in FIG. 7. Removal region(s) 170 thus allow removal of centering fixture 100 from a tight tolerance setting without damaging ESC system 102 or centering fixture 100.

Centering fixture 100 may be made of any material having sufficient strength to be reused and machinable to the desired tolerances. In one example, centering fixture 100 may be made from a hard plastic, a metal, or a metal compound.

Embodiments of the disclosure may also include a method of training automated handling system 108 for a semiconductor processing system regarding aligning circular wafer 104 to circular chuck 110. The method may include placing centering fixture 100 on circular chuck 110 of a semiconductor processing system, as shown in FIG. 7, i.e., using carrier arm 106 (FIG. 9), then calibrating automated handling system 108 based on a centered position of circular wafer 104 provided by centering fixture 100. Again, the calibration can include any now known or later developed processing steps required for automated handling system 108 used to obtain and record the centered position, e.g., recording carrier arm 106 position in three-dimensional space—X, Y, Z and various yaw positions. For example, as shown in FIG. 9, circular wafer 104 may be centered relative to circular chuck 110 using centering fixture 100, and the position of carrier arm 106 used to place circular wafer 104 can be recorded as the 'centered position' for future use. As understood, many automated handling systems 108 include built-in aligner systems, e.g., with embedded software, to carry out calibration/teaching processes. The use of centering fixture 100 removes human variation in trying to visually center wafer 104 relative to chuck 110, improving accuracy, repeatability, and robot programming methods.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A centering fixture for centering a wafer on a chuck, the centering fixture comprising:
   a body including an upper surface, a lower surface, an inner periphery and an outer periphery;
   a chuck seat positioned in a lower portion of the inner periphery and configured to mate the body with the chuck; and
   a wafer seat positioned in an upper portion of the inner periphery above the chuck seat, the wafer seat configured to receive and center the wafer on the chuck.

2. The centering fixture of claim 1, further comprising a handler slot in the upper surface, the handler slot configured to allow at least a portion of an automated handler carrier arm to pass through the body to access the wafer.

3. The centering fixture of claim 2, wherein the body is circular and the handler slot includes opposing parallel sides extending tangentially from the inner periphery to the outer periphery.

4. The centering fixture of claim 1, further comprising at least one removal region positioned within the lower surface and the outer periphery.

5. The centering fixture of claim 4, wherein each removal region includes a rounded inner surface extending between the outer periphery and the lower surface.

6. The centering fixture of claim 1, wherein the wafer seat includes a horizontal surface configured to hold the wafer, and an entry wall connecting the horizontal surface and the upper surface and extending at a non-orthogonal angle to both.

7. The centering fixture of claim 1, wherein the chuck seat includes a stepped seat including a pair of radially spaced internally facing surfaces separated by a horizontal surface.

8. The centering fixture of claim 7, wherein each surface of the stepped seat engages a surface of the chuck.

9. The centering fixture of claim 1, wherein the body, the wafer and the chuck are circular, and wherein the chuck seat is configured to concentrically mate the body with the chuck and the wafer seat is configured to receive and concentrically center the wafer on the chuck.

10. A method of training an automated handling system for a semiconductor processing system regarding aligning a wafer to a chuck of the semiconductor processing system, the method comprising:
    placing a centering fixture on the chuck of the semiconductor processing system, the centering fixture including:
        a body including an upper surface, a lower surface, an inner periphery and an outer periphery,
        a chuck seat positioned in a lower portion of the inner periphery and configured to mate the body with the chuck, and
        a wafer seat positioned in an upper portion of the inner periphery above the chuck seat, the wafer seat configured to receive and align the wafer on the chuck; and
    calibrating the automated handling system based on a centered position of the wafer provided by the centering fixture.

11. The method of claim 10, wherein the wafer, the chuck, the body, the chuck seat and the wafer seat are circular, and the wafer seat concentrically aligns the wafer on the chuck.

12. An electrostatic chuck (ESC) system, comprising:
    a chuck; and
    a centering fixture for centering a wafer on the chuck, the centering fixture including:
        a body including an upper surface, a lower surface, an inner periphery and an outer periphery,
        a chuck seat positioned in a lower portion of the inner periphery and configured to mate the body with the chuck, and
        a wafer seat positioned in an upper portion of the inner periphery above the chuck seat, the wafer seat configured to receive and center the wafer on the chuck.

13. The ESC system of claim 12, wherein the wafer, the chuck, the body, the chuck seat and the wafer seat are circular, and the chuck seat concentrically mates the body with the chuck and the wafer seat concentrically aligns the wafer on the chuck.

14. The ESC system of claim 12, wherein the centering fixture further includes a handler slot in the upper surface, the handler slot configured to allow at least a portion of an automated handler carrier arm to pass through the body to access the wafer.

15. The ESC system of claim 14, wherein the body is circular and the handler slot includes opposing parallel sides extending tangentially from the inner periphery to the outer periphery.

16. The ESC system of claim 12, wherein the centering fixture further includes at least one removal region positioned within the lower surface and the outer periphery.

17. The ESC system of claim 16, wherein each removal region includes a rounded inner surface extending between the outer periphery and the lower surface.

18. The ESC system of claim 12, wherein the wafer seat includes a horizontal surface configured to hold the wafer, and an entry wall connecting the horizontal surface and the upper surface and extending at a non-orthogonal angle to both.

19. The ESC system of claim 12, wherein the chuck seat includes a stepped seat including a pair of radially spaced internally facing surfaces separated by a horizontal surface.

20. The ESC system of claim 19, wherein each surface of the stepped seat engages a surface of the chuck.

* * * * *